United States Patent [19]

Hanson

[11] Patent Number: 4,464,793
[45] Date of Patent: Aug. 7, 1984

[54] RESONANCE SELECTION CIRCUIT FOR SERIES CONNECTION IN A RADIO RECEIVER CIRCUIT

[75] Inventor: Raymond F. Hanson, Whitesboro, N.Y.

[73] Assignee: General Electric Company, New York, N.Y.

[21] Appl. No.: 383,075

[22] Filed: May 28, 1982

[51] Int. Cl.³ .............................................. H04B 1/16
[52] U.S. Cl. ................................... 455/154; 455/212; 455/218; 455/338
[58] Field of Search ............... 455/205, 212, 214, 218, 455/221, 222, 245, 334, 338, 154; 329/140-143; 333/177

[56] References Cited

U.S. PATENT DOCUMENTS

| | | |
|---|---|---|
| 2,770,721 | 11/1956 | Clark . |
| 3,129,288 | 4/1964 | De Vries .............................. 455/338 |
| 3,188,571 | 6/1965 | Michael . |
| 3,339,026 | 8/1967 | Csicsatka et al. .................... 455/205 |
| 3,568,068 | 3/1971 | Russell, Jr. . |
| 3,626,294 | 12/1971 | Dancy . |
| 3,783,387 | 1/1974 | Wernli . |
| 3,896,386 | 7/1975 | Ohsawa . |
| 4,112,371 | 9/1978 | Ogita . |

Primary Examiner—Jin F. Ng
Attorney, Agent, or Firm—George R. Powers; John F. Cullen; Leonard J. Platt

[57] ABSTRACT

A selection circuit for series connection between the output of the detector stage and the input of the audio amplifier. The selection circuit requires a minimum number of components and is useful to drive a tuning indicator or similar type circuit.

6 Claims, 1 Drawing Figure

RESONANCE SELECTION CIRCUIT FOR SERIES CONNECTION IN A RADIO RECEIVER CIRCUIT

FIELD OF INVENTION

The invention relates to radio receiver circuits for extracting a portion of a detected signal and more particularly to a resonance circuit for series connection between a radio receiver detector stage and an audio output stage for extracting a portion of the signal produced at the detector output. The resonance circuit selectively extracts a portion of the detector ouput without unnecessarily loading the detector output. A signal generated by the circuit can advantageously be used for various purposes including, for instance, controlling indicator, squelch or scanning circuits.

BACKGROUND OF THE INVENTION

Heretofore, radio receivers having trigger circuits associated therewith have employed voltage divider type circuits connected to a detector output to divert a portion of the complete detected signal to the trigger circuit. Consequently, a reduced portion of the complete detected signal is applied to an audio output stage, and thus the audio output circuit must provide greater amplification to achieve the same level audio output. These circuits require additional amplifier and filter stages, adding to radio receiver cost and impose an increased load on battery operated receivers.

An example of one such divider circuit is shown in U.S. Pat. No. 3,896,386, Tuning Indicator With Noise Signal Indicator. Referring to FIG. 2 thereof, which is a diagram of an FM receiver incorporating an indicator circuit, the detector 16 is connected in parallel to both the stereo demodulator and to the input 23 of the noise selector circuit 22. Consequently, the signal supplied to the stereo demodulator 17 is the detected signal less that portion of the detected signal which is applied to the noise selector circuit 22 through input 23. U.S. Pat. No. 3,896,386 does not disclose the value of the capacitor connected between the FM detector and the preamplifier. A large value capacitor unnecessarily loads the detector output while a small value capacitor does not extract a signal of useable magnitude. A preamplifier will thus be required when a small valued capacitor is used. Further, the noise selector circuit 22 does not utilize all the extracted signal, but instead amplifies only that portion of the signal within the pass band of a tuned circuit 24. The noise selector circuit 22 of the U.S. Pat. No. 3,896,386 includes components such as additional resistors, capacitors and transistors not required in the selector circuit of the present invention, and the selector circuit 22 imposes a load on the power supply which is greater than the load imposed by the selector circuit of the present invention.

SUMMARY OF THE INVENTION

In accordance with the present invention, a transformer having a primary coil and a capacitance in parallel with the primary coil is adapted for series connection between a detector stage and an audio stage of a radio receiver. The primary coil and its associated capacitance resonate in response to an applied signal within the resonance range of the tuned primary and induce a signal in a secondary coil associated with the tuned primary coil. The secondary produces a signal on at least one of its legs, in response to the induced signal which indicates that a signal, within the resonance range of the tuned primary, is being applied to the tuned primary. Accordingly, the tuned primary transformer provides an efficient mechanism for selectively extracting signals within a predetermined frequency range from a detected signal and requires only a small number of components for its implementation. The extracted signal is directly useable and does not require filtering or preamplification. Accordingly, the circuit of the present invention requires only a minimum number of components for its implementation.

The tuned primary transformer can be advantageously coupled to an additional amplifier circuit and a voltage doubler circuit to for instance provide a single ended output signal useable for instance to control a driver for an indicator or other control circuit.

The tuned primary transformer is particularly useful for extracting noise signals to provide an indication of whether or not the receiver is accurately tuned to a carrier transmitted on a channel frequency.

The tuned primary transformer exhibits little resistance or load to signals outside the resonance range of the primary and accordingly does not unnecessarily load the detector output.

The tuned primary selection circuit employs a minimum number of components and provides a cost effective means for selectively extracting a signal within a predetermined frequency range from the detected signal. The selector circuit of the present is particularly useful to augment an AM/FM integrated radio receiver circuit chip which includes for instance a detector and an audio amplifier but which, because of economic restraint on the number of pins, does not include a circuit for producing a control signal for driving an indicator light on other control means.

Further objects and features and a more complete understanding of the present invention which may admit to a number of possible variations will be seen from the following detailed description which taken in conjunction with the attached drawing represents the preferred embodiments of this invention.

BRIEF DESCRIPTION OF THE THE DRAWING

The inventive idea disclosed herein is capable of receiving a variety of electrical expressions, the accompanying drawing is included for the purpose of illustrating a particular embodiment of this inventive idea and is not intended to be limiting on the scope thereof. In this drawing:

FIG. 1 is a schematic diagram illustrative of a tuned primary selection circuit of the present invention as connected between a detector stage and an audio output stage of an AM/FM integrated circuit radio receiver.

DETAILED DESCRIPTION OF THE DRAWING

Figure 1:
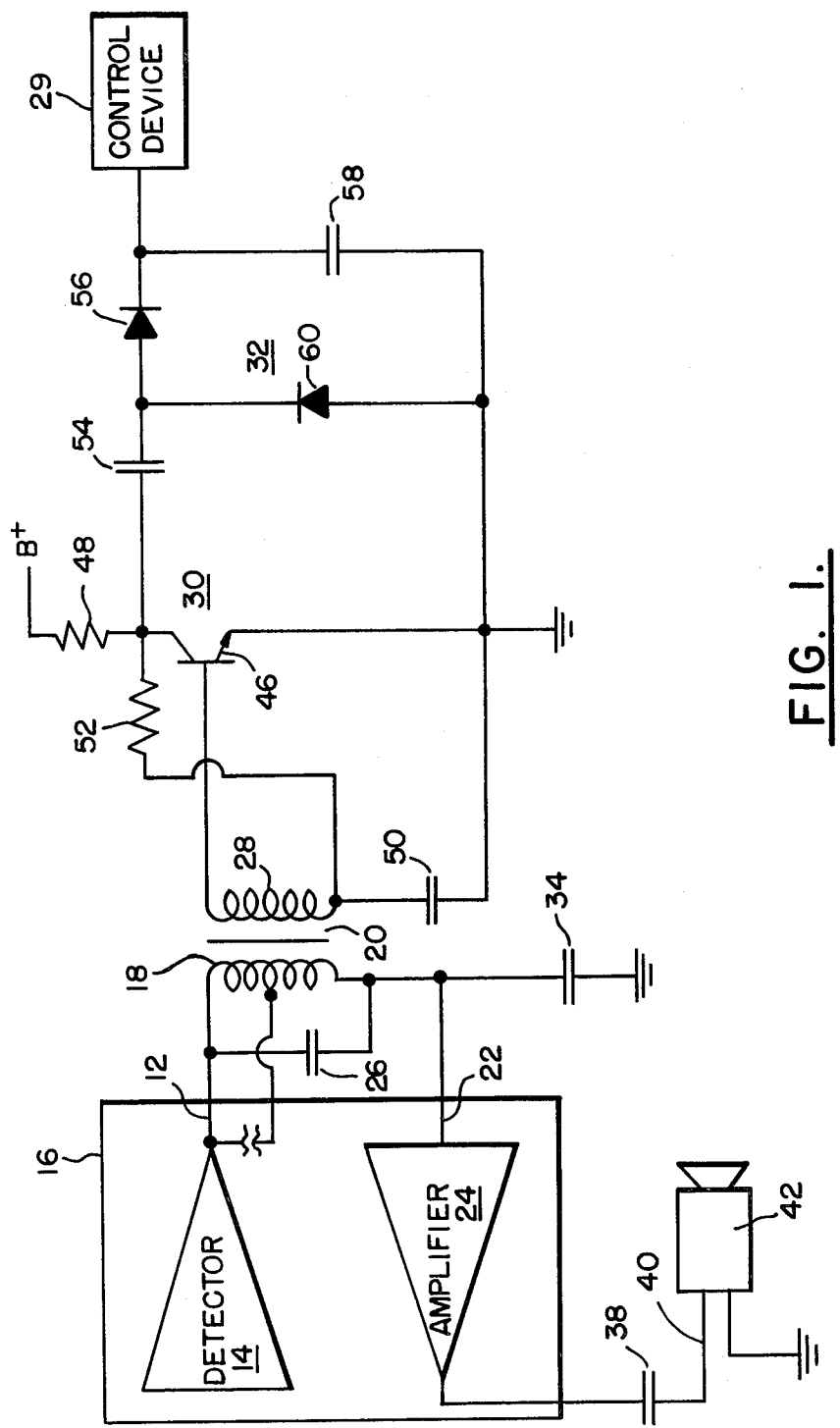

One embodiment of a selective trigger circuit is illustrated in FIG. 1 wherein an output 12 from a detector 14 incorporated within an integrated circuit 16 is connected in series through a tuned primary 18 of a transformer 20 to an input 22 of an audio amplifier 24 also included within the integrated circuit 16. A capacitor 26 is connected in parallel across the legs of the primary coil and causes the primary coil 18 to have an LC resonance characteristic for a predetermined frequency range. Signals within this predetermined frequency range cause this primary coil to resonate and induce a signal in a secondary coil 28 of the transformer 20.

The secondary 28 in response to the induced field produces a signal indicating that there is a detectable effect such as noise occurring within at least a portion of the resonance frequency range, including the skirt thereof, of the primary coil 18. The signal produced by the secondary can then be used as a trigger signal to drive various control devices 29 employed in combination with a conventional radio receiver, such as a driver for a squelch circuit, an indicator circuit or a scanning circuit. The signal produced by the secondary coil 28 is a low level signal that is advantageously enhanced by an amplifier circuit 30 and a voltage doubler circuit 32 to for instance provide a signal of level sufficient to control a driver.

While the circuit of the present invention is usable in combination with any number of conventional radio receivers, this circuit has particular advantage when used in combination with an integrated circuit radio receiver circuit 16 such as that described in U.S. Pat. No. 3,936,750 to Peil et al., U.S. Pat. No. 3,999,138 to Peil et al., U.S. Pat. No. 4,025,871 to Peil, U.S. Pat. No. 4,050,022 to McFadyen et al., U.S. Pat. No. 4,050,029 to McFadyen and U.S. Pat. No. 4,201,946 to McFadyen, the disclosures of which are incorporated herein by reference. Such an integrated circuit radio receiver circuit is commercially available as part number TA7613P manufactured by Toshiba Corporation. In such integrated circuits, the signal level produced at the detector output is relatively low and it is desirable to avoid imposing an unnecessary load on the detector output within the desired signal range. The circuit of the present invention, employs a tuned primary 18 which represents a load to the detector only within the predetermined resonance frequency range of the tuned primary 18. For instance the tuned primary can have a resonance frequency range in the range between approximately 100-300 KHz, a resonance range well above the FM audio frequency range and the frequency ranges of other information or message signals. The selection circuit of the present invention employs a primary which exhibits little effective resistance to signals outside the resonance range of the tuned primary and a load only for those signals within the resonance frequency range of the tuned primary. Signals outside the resonance range of the tuned primary 18, pass through the primary essentially unattenuated to the audio amplifier stage 24.

The selection circuit of the present invention is particularly useful to drive a tuning control circuit or a squelch circuit.

An example of the operation of the selection circuit of the present invention as used in combination with a conventional FM radio receiver is now given to illustrate the principles associated with the operation of the selection circuit. The particular parameters recited and bandwidths used in this example are intended to be merely illustrative of those parameters which one skilled in the art would consider typical of a conventional radio receiver and these recited parameters are not intended to be limiting on the scope of the present invention either with regard to the recited particular parameters or the components of the radio receiver.

The spectral distribution of an FM signal can include the following components: (i) L&R signal, 50-15000 Hz, (ii) 19 KHz pilot, (iii) suppressed sub-carrier signals 23-53 KHz and (iv) subsidary communication authorization 60-74 KHz. The FM signal can then generally be considered to occupy a bandwidth ±75 KHz from a carrier frequency. FM channels have been designated at 200 KHz spacings affording each an FM signal, a 200 KHz band width or a bandwidth of ±100 KHz from the channel frequency. The FM signal bandwidth includes the 75 KHz signal band and a 25 KHz guard band. Additionally, the FCC does not ordinarily assign adjacent channels for use within a local area. Thus, if for instance, the 99.9 MHz channel is assigned, the channels at 100.1 MHz and 99.7 MHz would usually not be assigned.

By way of illustrating an example of the principles of operation of the present invention, it is helpful to consider the output of a typical FM detector. The detector output as known to those skilled in the art can include (i) a primary frequency band extending between ±0-75 KHz from the center frequency and secondary frequency band in the 100-300 KHz range. The primary band can for instance be the 3 db pass band of the detector while the secondary band can for instance encompass a pass band from 3 db down to 20 db. When an FM receiver is tuned to an FM channel frequency bearing an FM signal, the primary output band of the detector contains the FM signals while the secondary band includes low level noise.

The selector circuit of the present invention reads the detector output which falls within the secondary band. In a preferred embodiment, the secondary band is 100-300 KHz but any similar range of frequencies is advantageously useable.

As known to those skilled in the art noise exists throughout the frequency spectrum. When a receiver is not tuned to a channel frequency the radio front end receives and amplifies noise. In the absence of an FM carrier or signal, the front end is not driven into limiting and consequently the noise is fully amplified by the receiver. In the absence of an FM carrier or signal, the gain of the IF strip is not limited or reduced and the noise in the 100-300 Khz range passing therethrough is amplified to a first level.

When a receiver is tuned to an FM carrier or signal, the radio front end is driven into limiting by the signal and consequently the gain of the IF is reduced and becomes less than the level of gain which the IF strip provides when no FM signal or carrier is present. When a receiver is tuned to an FM carrier or signal, the noise within the 100-300 Khz range is only slightly amplified to a second level wherein the first level (no carrier present) is greater than the second level (carrier present).

The selection circuit of the present invention passes these noise signals and their relative signal levels through the tuned primary and the secondary to provide a signal at the output of the secondary which is at a first level when no carrier is present and which is at a second level when a carrier is present. The terms first and second levels are relative terms which are intended to allow one skilled in the art to select a signal level which is adequate for a particular purpose to activate or deactivate a control function. In a preferred embodiment, when the tuned primary is used to control a tuning indicator driver, a secondary signal level less than a prespecified minimum indicates that the receiver is tuned to an FM signal and a secondary signal level in excess of a prespecified level indicates the receiver is not tuned.

Accordingly, the tuned primary selection circuit of the present invention provides a signal for driving tuning indicators, squelch controls and other control mechanisms of a radio receiver according to whether or not a strong signal occurs within the secondary band of the detector.

In a preferred embodiment, the selection circuit of the present invention employs a dielectric capacitor of approximately 0.0047 microfarads connected in parallel with the primary 18 of the transformer 20 therewith. In a preferred embodiment, the tuned primary exhibits resonance in the frequency range extending between approximately 100 KHz and 300 KHz. The values of the transformer and capacitor should be selected to establish resonance range within the desired frequency range.

The detector output 12 is advantageously connected to one leg of the primary coil or to an intermediate tap within the primary coil 18 with the capacitor 26 being connected across the legs of the transformer. At least one leg of the primary coil is advantageously connected directly the input 22 of the audio amplifier 24 also included within the chip. An additional filter capacitor 34 can be connected between ground and audio amplifier input 22 to filter the audio input. The output of the audio amplifier 24 is advantageously connected through an isolating capacitor 38 to the input 40 of an audio transducer such as a speaker 42.

The output of the secondary 28 is advantageously connected to an amplifier circuit 30. In a preferred embodiment, the amplifier circuit 30 comprises an NPN common emitter transistor 46 having its base connected to the output of the secondary, its emitter adapted for coupling to ground and its collector adapted for coupling to a power supply through a current limiting resistor 48. The other leg of the secondary is adapted for coupling to ground through an AC bypass capacitor 50 and to the collector of the common emitter 46 through a d.c. stabilizing bias resistor 52. In a preferred embodiment resistor 48 has a value of approximately 680 ohms and capacitor 50 is a 0.022 microfarad dielectric capacitor.

The collector output of the amplifier circuit is advantageously coupled to the input of a voltage doubler circuit 32 through an isolation capacitor 54 and more particularly to the anode of a rectifying diode 56 having its cathode adapted for connection to a driver circuit 29. A filter capacitor 58 can advantageously be used to couple the cathode of diode 56 to ground. Capacitor 58 in a preferred embodiment has a value of approximately 10 microfarad. The voltage doubler circuit 32 further comprises a diode 60 having its cathode connected to the anode of diode 56 and its anode adapted for coupling to ground. Moreover, the selection circuit of the present invention can be further advantageously enhanced by including additional circuits in combination therewith.

As previously stated, output of the voltage doubler circuit 32 is adapted for connection to a driver circuit 29 for controlling indicator or control devices associated with the radio circuit and known to those skilled in the art.

It will be appreciated that the present invention provides a practical, cost-effective and efficient circuit for selectively extracting noise from the output of a detector stage output without unnecessarily loading the detector or diminishing audio or other information bearing portions of the detected signal. The selection circuit of the present invention is particularly attractive because it requires only a minimum number of components. Although the selection circuit of the present invention has been described with reference to FIG. 1 it is readily apparent that the selection circuit of the present invention can be used with a variety of control or indicator circuits. Additionally, while the present invention has been described in its preferred form with a certain degree of particularity, it is understood that the present disclosure of the preferred embodiment is made by way of example and that modifications in the details of construction may be resorted to without departing from the true spirit and scope of this invention. It is therefore intended that the patent shall cover, by suitable expression of the appended claims, whatever features of patentable novelty exists in the invention disclosure.

What is claimed is:

1. A selection circuit adapted for connection in a superheterodyne radio receiver circuit, being responsive to the tuning state of said receiver, and for producing a signal indicative of the tuning state of said receiver, said radio receiver circuit including tuning, detector and audio output stages, said selection circuit comprising:

a transformer including a primary coil having a pair of legs said primary coil of said transformer being adapted for series connection between said detector stage and said audio output stage, a capacitor connected in parallel with said primary coil establishing a resonance frequency range and for causing resonance between said primary coil and said capacitor when a signal within the resonance range is applied to the primary coil, said transformer further including a secondary coil having a pair of legs and being associated with said primary coil and for producing a signal on at least one of said legs characteristic of said primary coil resonance.

2. The selection circuit as defined by claim 1 wherein said primary coil and said capacitor in combination exhibit resonance over at least a portion of a non-message bearing frequency range.

3. The selection circuit as defined by claim 1 wherein said primary coil and said capacitor in combination exhibit resonance over a frequency range between approximately 100 and 300 KHz.

4. The selection circuit as defined by claim 1 wherein said transformer primary includes an intermediate tap adapted for connection to the output of said detector and at least one of said primary coil legs is adapted for connection to said audio output stage.

5. The selection circuit as defined by claim 1 further including an amplifer means having an amplifier input connected to one leg of said secondary coil, and an amplifier output.

6. The selection circuit as defined by claim 5 further including a voltage doubler means, including a doubler input and a doubler output, said doubler means connected at the doubler input to said amplifier output and being adapted for connection to user circuit.

* * * * *